(12) United States Patent
Lee (10) Patent No.: US 6,207,573 B1
(45) Date of Patent: Mar. 27, 2001

(54) DIFFERENTIAL TRENCH OPEN PROCESS

(75) Inventor: Brian S. Lee, New York, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/314,358

(22) Filed: May 19, 1999

(51) Int. Cl.⁷ ................................................. H01L 21/311
(52) U.S. Cl. ........................... 438/700; 438/717; 438/723
(58) Field of Search ...................... 438/700, 706, 438/714, 723, 724, 725, 735, 736, 737, 743, 744

(56) References Cited

U.S. PATENT DOCUMENTS

| | | | |
|---|---|---|---|
| 5,298,790 | 3/1994 | Harmon et al. | 257/622 |
| 5,562,801 | 10/1996 | Nulty | 156/643.1 |
| 5,814,547 | * 9/1998 | Chang | 438/329 |
| 5,877,090 | * 3/1999 | Padmapani et al. | 438/714 |
| 6,020,230 | * 2/2000 | Wu | 438/222 |
| 6,037,208 | * 3/2000 | Wei | 438/243 |

FOREIGN PATENT DOCUMENTS 0809281   11/1997   (EP) .

OTHER PUBLICATIONS

XP000415431, Takeshi Fujino, Atushi Ishii, Kenji Kawai, Motoko Matsuba, Shuji Nakao, Yaichiro Watakabe and Yoichi Akasake; "Novel Electron Beam Direct Writing Technique for the Pattern of Quarter–Micron Devices"Dec. 1992, pp. 4262–4267.

* cited by examiner

Primary Examiner—Benjamin L. Utech
Assistant Examiner—Kin-Chan Chen
(74) Attorney, Agent, or Firm—Donald B. Paschburg

(57) ABSTRACT

In accordance with the invention, a method for opening holes for semiconductor fabrication includes the steps of providing a pad stack on a substrate, forming a hard mask layer on the pad stack, the hard mask layer selectively removable relative to the pad stack, patterning a resist layer on the hard mask layer, the resist layer being selectively removable relative to the hard mask layer and having a thickness sufficient to prevent scalloping, etching the hard mask layer selective to the resist layer down to the pad stack, removing the resist layer. After removing the resist layer, the pad stack is etched selective to the hard mask layer such that a hole is opened down to the substrate.

21 Claims, 6 Drawing Sheets

DIFFERENTIAL TRENCH OPEN PROCESS

BACKGROUND

1. Technical Field

This disclosure relates to semiconductor fabrication and more particularly, to an improved method for opening deep trenches through a relatively thick hard mask by employing a thinner resist layer.

2. Description of the Related Art

In the semiconductor industry, there is a great initiative to provide improved performance from smaller and smaller components. As with all semiconductor devices, semiconductor memories are pushed to the limits of performance. The capabilities of semiconductor memory components are often needed to perform at ever increasing levels from one generation of designs to the next. In one example, a need exists for increasing a capacitance value for deep trenches used for capacitor cells in dynamic random access memories.

Capacitance may be increased for deep trench capacitors by increasing the surface area of the storage node within the deep trench. However, increasing the length or width of the cell impacts the layout area of the semiconductor memory device since each row or column would have to increase by the augmented length and/or width of the new sized trenches. Therefore, this approach is not desirable.

The surface area of the storage node may also be increased by increasing the depth of the trench. This has proven to be a difficult task. The depth of the deep trenches has been limited by a hard mask used to etch the deep trench openings in a substrate.

Figure 1:
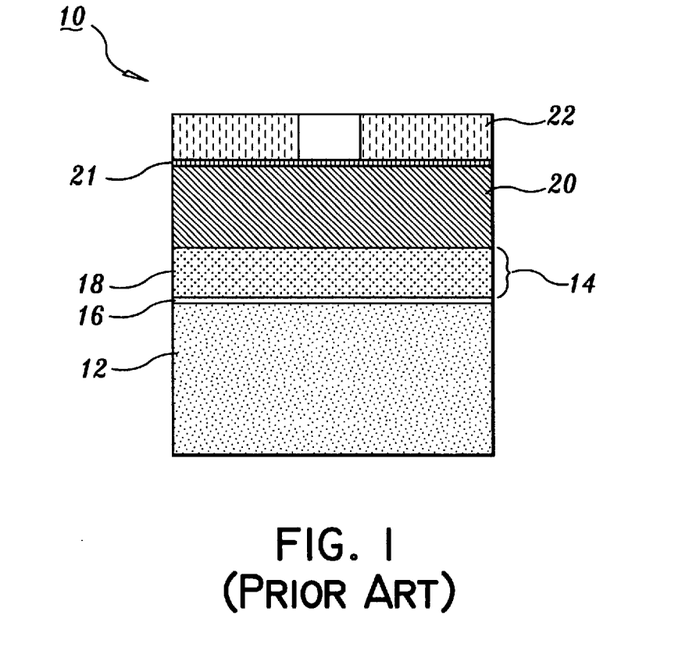
FIG. 1 is a cross-sectional view of a semiconductor device having a resist layer patterned thereon in accordance with the prior art.

Referring to FIG. 1, a semiconductor memory device 10 includes a substrate 12, preferably a silicon substrate. A pad stack 14 is deposited on the substrate 12. Pad stack 14 may include a silicon oxide layer 16 and a nitride layer 18. A hard mask layer 20 is formed on the pad stack 14. Hard mask layer 20 may include borosilicate glass, for example. An anti-reflection coating (ARC) 21 is deposited on hard mask layer 20 to assist in patterning a resist layer 22. Resist layer 22 is formed on ARC layer 21 and patterned over location where a deep trench will be etched in further processing steps. Resist layer 22 is relatively thick ranging from about 600 nm to about 800 nm in thickness. Resist layer 22 is required to be at least 600 nm in thickness to provide a sufficient amount of time to etch hard mask layer 20 and pad stack 14 in later steps.

Figure 2:
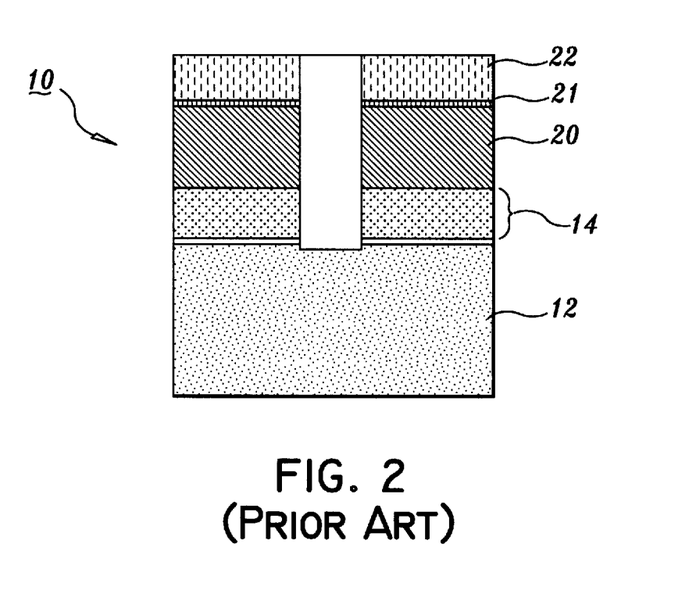
FIG. 2 is a cross-sectional view of the semiconductor device of FIG. 1 after etching down to a substrate in accordance with the prior art.
Figure 3:
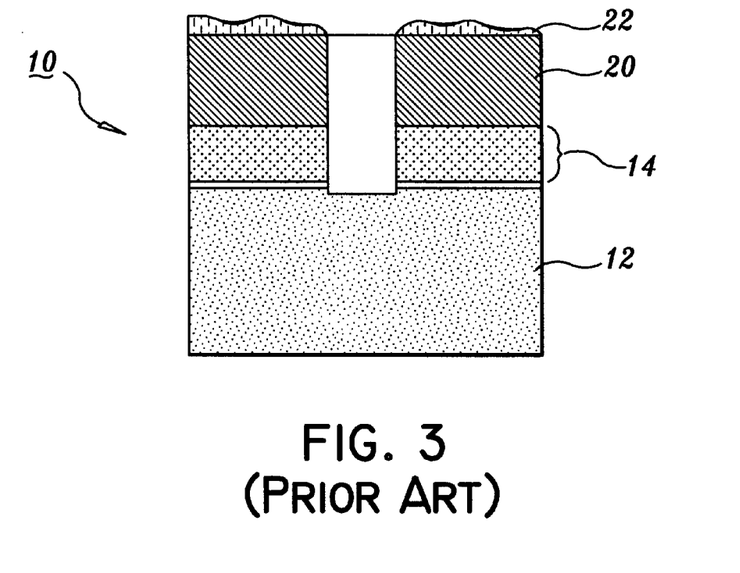
FIG. 3 is a cross-sectional view of the semiconductor device of FIG. 2 after removing the resist layer in accordance with the prior art.

Referring to FIG. 2, an etching process is performed to form a mask for etching substrate 12 to form deep trenches. The conventional process etches through ARC layer 21, hard mask layer 20 and pad stack 14. Although etching is selective to resist layer 22, resist layer 22 is eroded by the etching process and, therefore, a sufficient thickness must be maintained for resist layer 22. The etching continues until substrate 12 has been reached. Next, resist layer 22 and ARC layer 21 are removed from a top surface of the layer stack as shown in FIG. 3. This provides hard mask layer 20 on the top surface for etching substrate 12. It is to be understood that hard mask layer is between 600 nm and 700 nm in thickness. Larger thicknesses are avoided since etching larger thicknesses of hard mask layer 20 would require a thicker resist layer 22, and the thickness of resist layer 22 is limited by the lithographic process. If resist layer 22 becomes too thin during etching, scalloping occurs in the etched opening due to unavoidable damage on layer 22 by the etching process. This scalloping is undesirable and reduces the hard mask layer 20 thickness and thus reduces the possible depth of the trenches.

Figure 4:
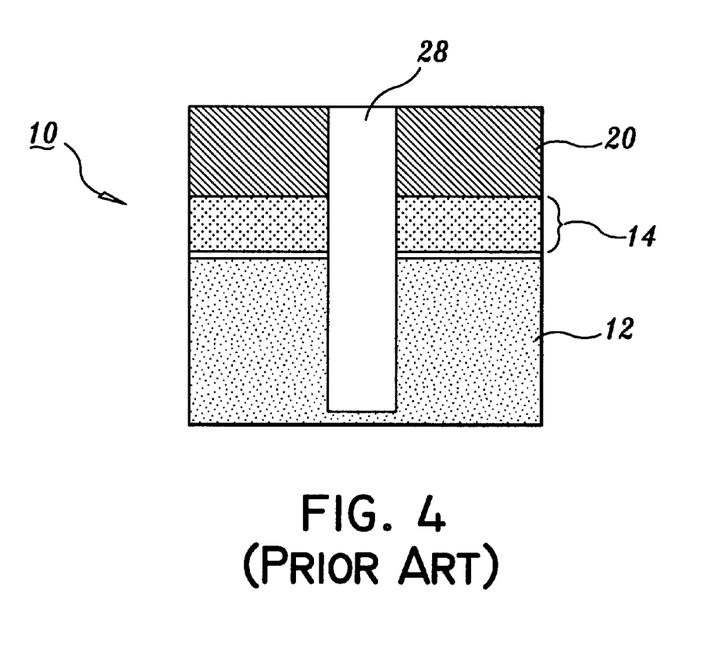
FIG. 4 is a cross-sectional view of the semiconductor device of FIG. 3 after etching a trench into the substrate in accordance with the prior art.

Referring to FIG. 4, hard mask layer 20 provides a selective etch mask for forming trenches 28 in substrate 12. Hard mask 20 is eroded during the etching process and therefore sufficient thickness of hard mask layer 20 must be provided. Unfortunately, the thickness of hard mask layer 20 is limited by the lithographic process and the thickness of resist layer 22, as described above. A hard mask layer that is thicker would require a thicker resist layer 22. Therefore, the thickness of hard mask layer is limited which results in a depth of trenches 28 which is also limited. Conventional trenches formed into substrate 12 are typically between about 6 microns and about 7 microns-deep for 0.2 micron groundrules. However, deeper trench depth is desirable to increase the capacitance value of trench capacitors to enhance device performance and yield.

Therefore, a need exists for a method for extending the depth of deep trenches in semiconductor devices. A further need exists for providing a method for permitting the use of thicker hard mask layers at a given resist thickness in processing of semiconductors.

SUMMARY OF THE INVENTION

In accordance with the invention, a method for opening holes in semiconductor fabrication includes the steps of providing a pad stack on a substrate, forming a hard mask layer on the pad stack, the hard mask layer selectively removable relative to the pad stack, patterning a resist layer on the hard mask layer, the resist layer being selectively removable relative to the hard mask layer and having a thickness sufficient to prevent scalloping, etching the hard mask layer selective to the resist layer down to the pad stack, and removing the resist layer. After removing the resist layer, the pad stack is etched selective to the hard mask layer such that a hole is opened down to the substrate.

A method for forming deep trenches in semiconductor fabrication includes the steps of providing a pad stack on a substrate, forming a hard mask layer on the pad stack, the hard mask layer selectively removable relative to the pad stack and the hard mask layer having a thickness of greater than about 700 nm, patterning a resist layer on the hard mask layer, the resist layer being selectively removable relative to the hard mask layer and having a thickness sufficient to prevent scalloping, etching the hard mask layer selective to the resist layer down to the pad stack layer, removing the resist layer. After removing the resist layer, the pad stack is etched selective to the hard mask layer such that a hole is opened down to the substrate and etching the substrate to form deep trenches using the hard mask layer as a mask such that the thickness of the hard mask layer enables the deep trenches to be formed to a depth of greater than or equal to 7 microns for 0.2 micron groundrules.

A method for opening holes for contacts in semiconductor fabrication includes the steps of providing a dielectric layer on a target layer, forming a hard mask layer on the dielectric layer, the hard mask layer selectively removable relative to the dielectric layer, patterning a resist layer on the hard mask layer, the resist layer being selectively removable relative to the hard mask layer and having a thickness sufficient to prevent scalloping, etching the hard mask layer selective to the resist layer down to the dielectric layer, removing the resist layer, after removing the resist layer, etching the dielectric layer selective to the hard mask layer such that a hole is opened down to the target layer and depositing a conductive material in the hole such that a contact is formed to the target layer.

In alternate methods, the step of patterning a resist layer may include the step of depositing a resist layer having a thickness of between about 300 nm and about 800 nm. The step of forming a hard mask layer may include the step of forming a hard mask layer having a thickness of between about 700 nm and about 3,000 nm. The hard mask layer may include a selectivity to the resist layer of between about 4 to 1 to about 8 to 1. The pad stack may include a selectivity to the hard mask layer of greater than about 2 to 1. The hard mask layer may include an oxide or a glass and the pad stack may include a nitride. The method may further include the step of applying an anti-reflection coating to the hard mask layer. The deep trenches may be formed to a depth of greater than or equal to 8 microns for 0.2 micron groundrules. The dielectric layer may include a selectivity to the hard mask layer of greater than about 2 to 1. The hard mask layer may include an oxide or a glass and the dielectric may include a nitride or an oxide.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor fabrication and more particularly, to an improved method for opening deep trenches through a relatively thick hard mask employing a thinner resist layer. Although described in terms of deep mask formation, the present invention is broader and applicable to any mask open processes which employ a hard mask below a resist layer. For example, the present invention is applicable to shallow trench isolation/active area mask open with a bard mask for semiconductor memories. The present invention includes a relatively thicker hard mask layer which aides in the formation of deeper trenches. The hard mask layer is etched using a resist layer, and the hard mask layer is used as a mask to etch a pad stack layer (or other dielectric mask layer). By advantageously etching the pad stack layer with the hard mask layer and etching the hard mask layer using the resist layer, a thicker hard mask layer may be employed. The limitations of the thickness of the hard mask layer in the prior art are no longer imposed and trenches may be etched deeper in accordance with the invention.

Figure 5:
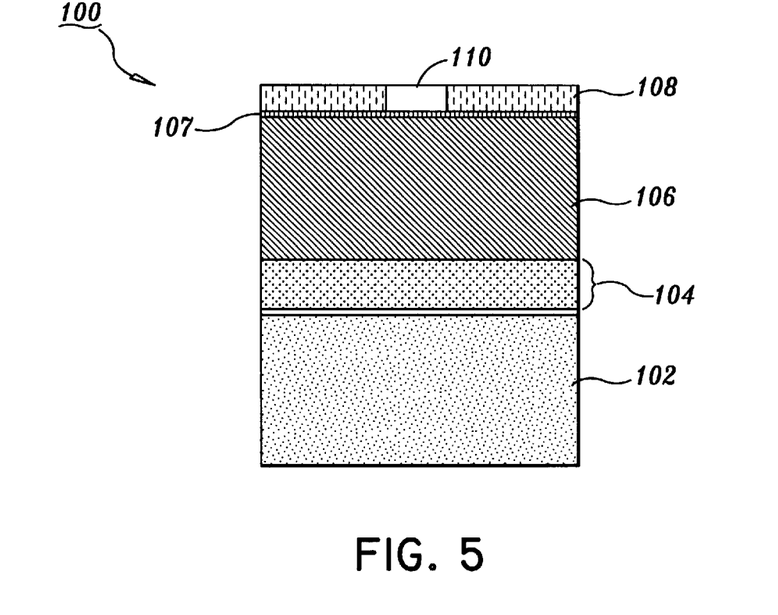
FIG. 5 is a cross-sectional view of a semiconductor device having a relatively thin resist layer patterned thereon in accordance with the present invention.

Referring now in specific detail to the drawings in which like reference numerals identify similar or identical elements throughout the several views, and initially to FIG. 5, a cross-sectional view of a semiconductor device 100 in accordance with the present invention is shown. A target layer 102 may include a substrate, such as a silicon substrate, a gallium arsenide substrate or other substrate, including active areas. Target layer 102 may alternatively include positions for the formation of trenches. In other embodiments, target layer 102 may include a metal layer or conductive line. A first layer 104 is deposited on target layer 102.

In one embodiment, first layer 104 may include a pad stack including multiple layers of dielectric layers. For example, an oxide layer and/or a nitride layer. First layer 104 may alternately be a single dielectric layer through which vias are to be formed to pass contacts to connect a conductive layer of target layer 102 to an upper level conductor. A second layer 106 is formed on first layer 104. Second layer 106 may be selectively etched relative to first layer 104. In a preferred embodiment, second layer 106 includes a hard mask layer which may include a glass such as borosilicate glass (BSG), borosilicate phosphorous glass (BSPG), arsenic silicate glass (ASG) or other glasses or oxides. A resist layer 108 is formed on second layer 106 which is selectively etchable relative to second layer 106. An antireflection layer (ARC) 107 may be deposited prior to the deposition of resist layer 108. ARC layer 107 may be provided to assist in the formation and patterning of resist layer 108. In a preferred embodiment, ARC layer 107 includes an organic ARC and an inorganic ARC, such as a dielectric ARC (DARC) for improved etch selectivity to resist layer 108.

In accordance with the invention, mask stacks as shown in FIG. 5 may include a second layer 106 to resist layer 108 selectivity which is greater than the selectivity between first layer 104 and second layer 106. For the present invention, first layer 104 to second layer 106 selectivity is preferably greater than 1 to 1. If second layer 106 includes a glass, second layer 106 to resist layer 108 selectivity is preferably between about 4 to 1 to about 8 to 1. If first layer 104 includes a nitride pad stack, first layer 104 to second layer 106 selectivity may be between about 1 to 1 to about 6 to 1.

Resist layer 108 is formed on second layer 106, preferably using standard photolithographic resists. Resist layer 108 is developed using standard lithographic processes to pattern trench or contact hole position on semiconductor device 100. The developing of resist layer 108 provides holes 110 through resist layer 108 to expose second layer 106 therebelow. In accordance with the present invention, resist layer 108 may include a thickness of between about 300 nm to about 800 nm, preferably between about 400 nm and about 700 nm. Since the selectivity between resist layer 108 and second layer, 106 is so great (4–8:1), a thinner resist layer may be employed as will be explained in in more detail below.

Figure 6:
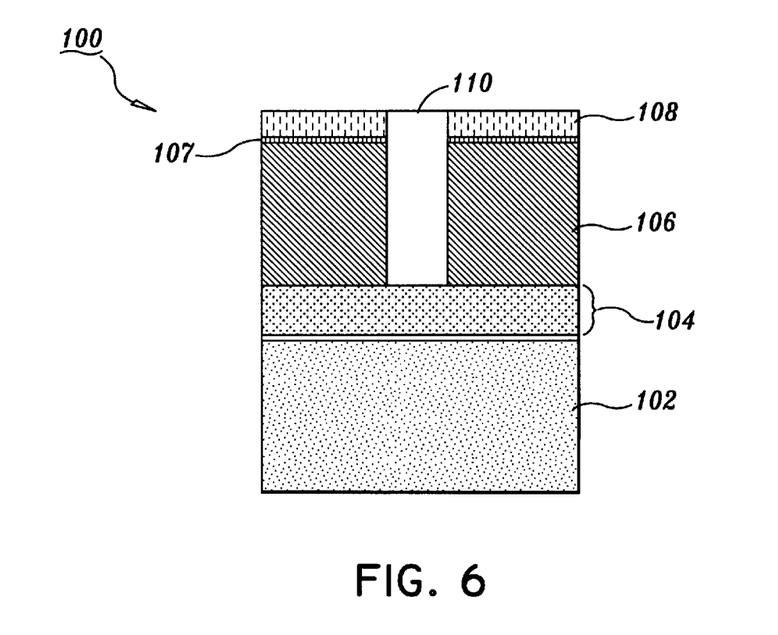
FIG. 6 is a cross-sectional view of the semiconductor device of FIG. 5 wherein the resist layer is employed to etch a hole through a hard mask layer in accordance with the present invention.

Referring to FIG. 6, resist layer 108 which is patterned with holes 110 is used as an etch mask layer to etch down to second layer 106. Resist layer 108 is not used to etch first layer 104. By only etching second layer 106, the etch process takes advantage of the selectivity between resist layer 108 and second layer 106. In this way, resist layer 108 may be deposited with a thinner thickness, for example, a thickness between about 300 nm to about 800 nm, preferably between about 400 nm and about 700 nm. Further, second layer 106 may be deposited with a greater thickness, for example, between about 700 nm and about 3000 nm, preferably between about 1000 nm and about 1500 nm.

In one illustrative example, resist layer 108 may be about 650 nm in thickness. Assuming a selectivity between resist layer 108 and second layer 106 on about 5 to 1, a second layer (hard mask layer) 106 may be etched through a thickness of about 2500 nm and still have a remaining thickness (about 150 nm) of resist layer 108 sufficient to prevent scalloping.

Figure 7:
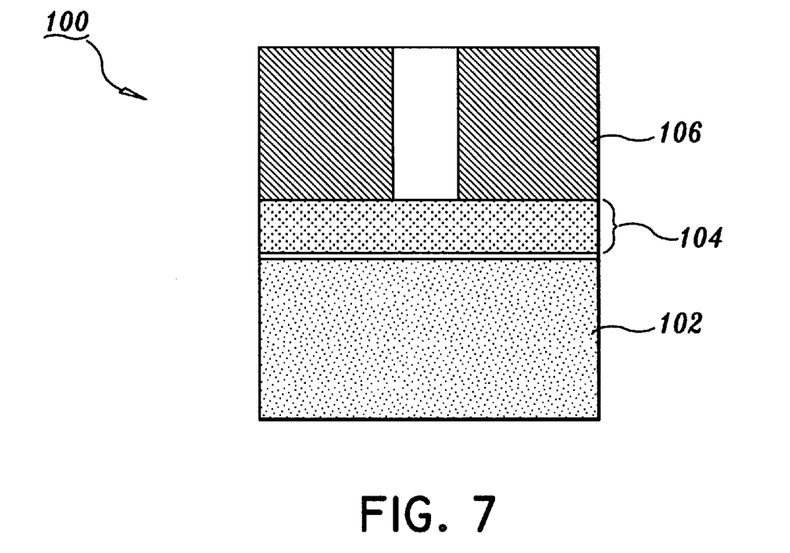
FIG. 7 is a cross-sectional view of the semiconductor device of FIG. 6 wherein the resist layer is removed in accordance with the present invention.

Referring to FIG. 7, after etching second layer 106, resist layer 108 and ARC layer 107 are removed from device 100. This leaves about the entire thickness of second layer 106 to be used as an etch mask for first layer 104.

Figure 8:
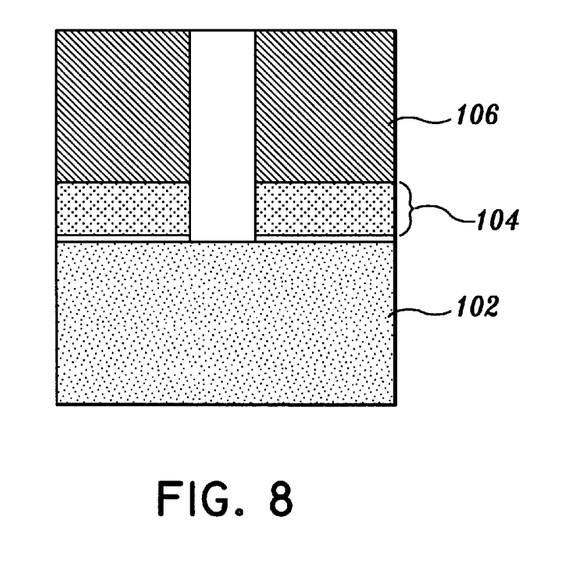
FIG. 8 is a cross-sectional view of the semiconductor device of FIG. 7 wherein the hard mask layer which is relatively thicker is employed to etch a hole through a pad stack in accordance with the present invention.

Referring to FIG. 8, an etch process is now employed to etch through first layer 104. Advantageously, a selectivity of second layer 106 to first layer 104 in accordance with the present invention provides for a more efficient etch of first layer 104. The selectivity of second layer 106 to first layer 104 is greater than the selectivity of resist layer 108 to first layer 104. In conventional methods, the resist layer is employed to etch the stack layer (first layer) which results in the erosion of the resist layer since selectivity between the stack layer and the resist layer may be about 1.5:1. In conventional methods, scalloping gets more severe since an already thinned resist layer which is severely damaged during etching for the second layer 106 is used to etch first layer 104. In accordance with the present invention, second layer 106 is used as an etch mask for first layer 104. In this way, the selectivity for etching may be 2:1 or greater. Second layer 106 is preferably thicker in accordance with the invention as described above. In addition, the thickness of second layer 106 is preserved since less is eroded away due to the selectivity advantage. A hole 103 is formed down to target layer 102 (e.g., the substrate).

Figure 9:
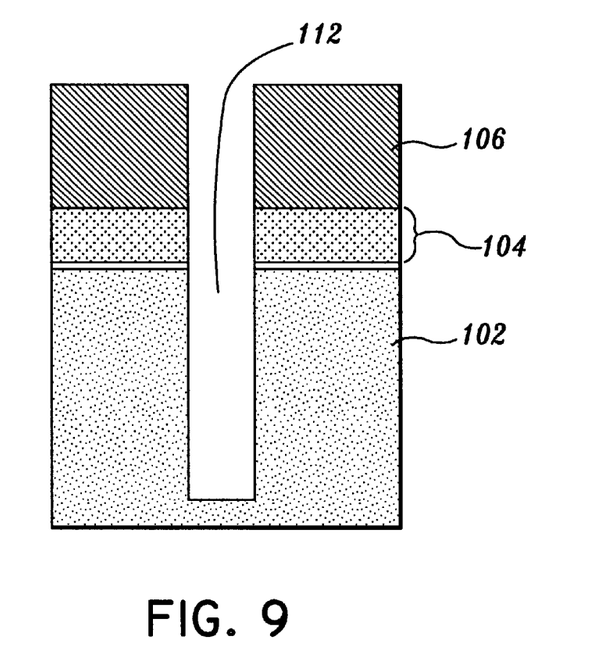
FIG. 9 is a cross-sectional view of the semiconductor device of FIG. 8 after etching a trench into the substrate in accordance with the present invention.

Referring to FIG. 9, target layer 102 is now etched using second layer 106 as a mask. Advantageously, the present invention provides a thicker second layer (hard mask layer) 106. This enables a longer etch time of target layer 102 resulting in deeper trenches 112. In a preferred embodiment, target layer 102 includes a semiconductor substrate, first layer 104 includes a pad stack and second layer 106 includes a hard mask layer. Trenches 112 include deep trenches for trench capacitors in memory cells in, for example, a dynamic random access memory (DRAM). Other memories may be used as well.

Figure 10:
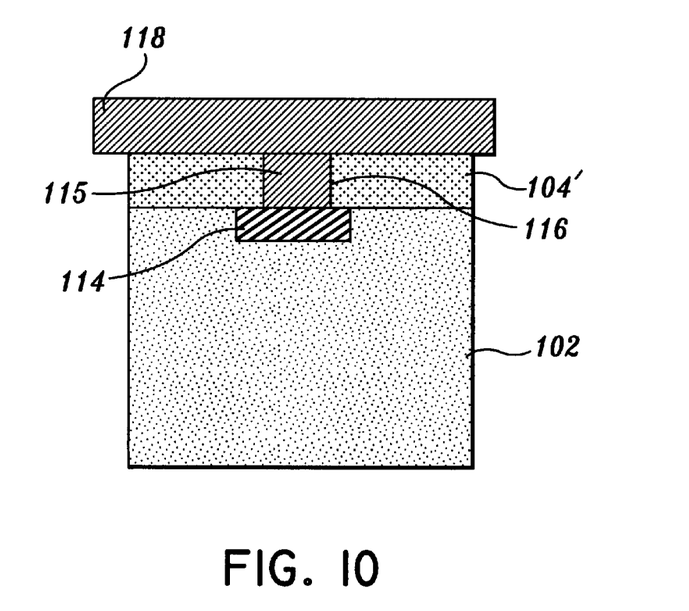
FIG. 10 is a cross-sectional view of the semiconductor device of FIG. 8 after removing the hard mask layer and depositing a conductive material to form a contact and a conductor on a higher level of the semiconductor device in accordance with the present invention.

Referring to FIG. 10, in an alternate embodiment, target layer 102 may include active areas (diffusion regions) or conductive regions 114 thereon. Using second layer 106 as a mask (See FIG. 8), first layer 104' is patterned down to target layer 102. Contacts 115 may be formed in holes or vias 116 to connect active areas (diffusion regions) or conductive regions to metal lines 118 or other conductors in higher levels of device 100. First layer 104' includes a dielectric layer which is preferably a nitride, however oxide or other dielectric materials may be used which include the selectivity characteristics with respect to the adjacent layers as described above. Other high aspect ratio etch processes may employ the present invention as well. Aspect ratios of width to depth may include, for example 1:4 ratios or greater.

Figure 11:
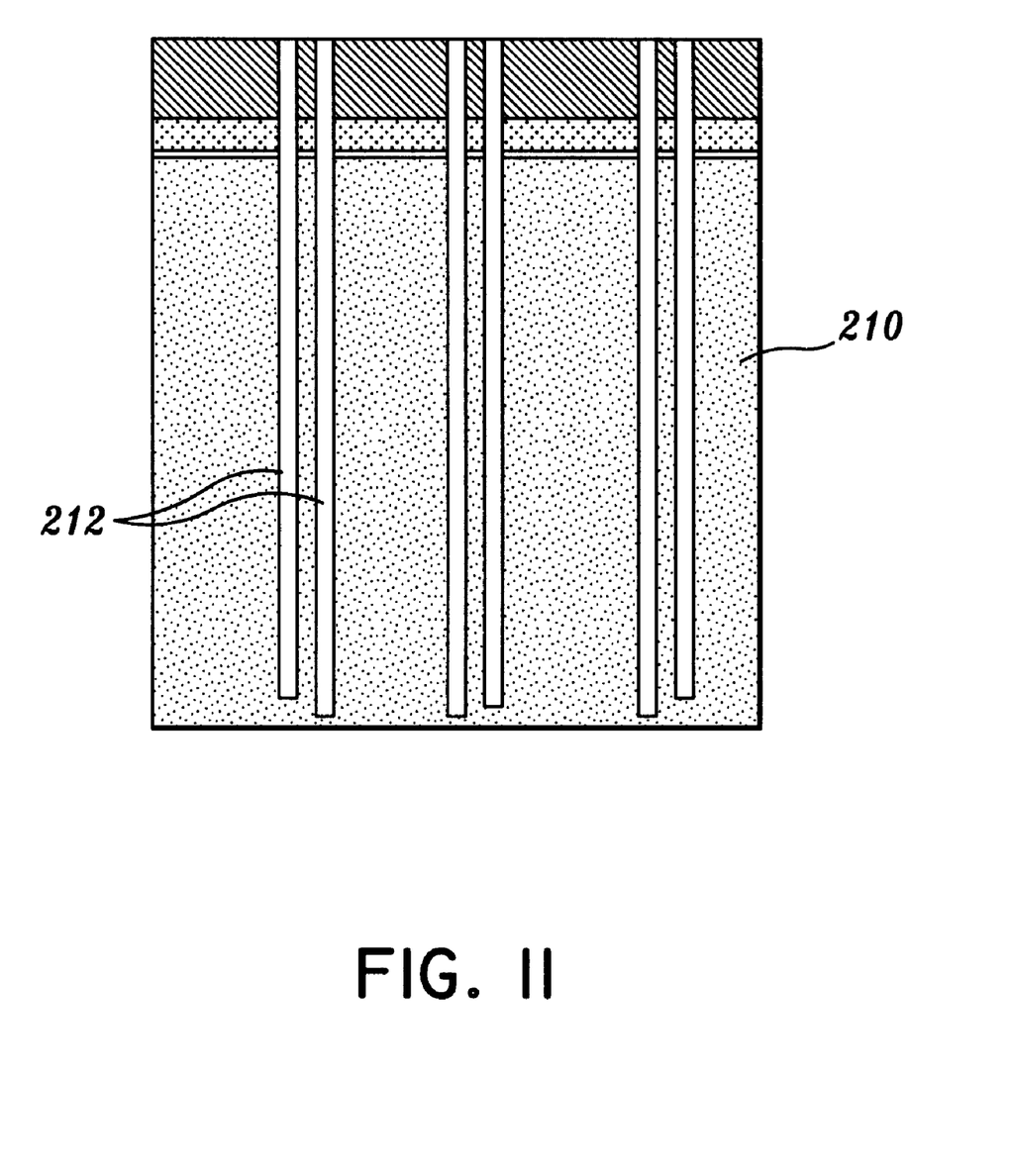
FIG. 11 is a cross-sectional view of a scanning electron microscope image showing deeper trenches formed in a substrate in accordance with the present invention.

Referring to FIG. 11, a cross-sectional view of deep trenches formed in a substrate etched in accordance with the present invention are shown based on scanning electron microscope (SEM) images. Deep trenches 212 were formed in a substrate 210 in accordance with the present invention and yielded surprising results. Deep trenches 212 were extended in depth by 50% over conventional trenches for 0.175 micron groundrules. This represents a marked improvement in deep trench formation processes without scalloping. Further, surface area of the trenches is increased accordingly. Trenches 212 exceeded a depth of 8 microns when a hard mask layer of 1,200 nm was employed for 0.175 micron groundrules. The present invention may achieve depths of 6 microns or greater, preferably the depths are greater than 8 microns for 175 micron groundrules. The invention not only permits deeper trenches, it also forms these trenches without scalloping.

Having described preferred embodiments for a differential trench open process (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for opening holes in semiconductor fabrication comprising the steps of:
providing a pad stack on a substrate;
forming a hard mask layer on the pad stack;
patterning a resist layer on the hard mask layer, the resist layer having a thickness to prevent scalloping;
etching the hard mask layer selective to the resist layer down to the pad stack;
removing the resist layer; and
after removing the resist layer, etching the pad stack selective to the hard mask layer such that a hole is opened down to the substrate.

2. The method as recited in claim 1, wherein the step of patterning a resist layer includes the step of depositing a resist layer having a thickness of between about 300 nm and about 800 nm.

3. The method as recited in claim 2, wherein the step of forming a hard mask layer includes the step of forming a hard mask layer having a thickness of between about 700 nm and about 3000 nm.

4. The method as recited in claim 1, wherein the hard mask layer includes a selectivity to the resist layer of between about 4 to 1 to about 8 to 1.

5. The method as recited in claim 1, wherein the pad stack includes a selectivity to the hard mask layer of greater than about 2 to 1.

6. The method as recited in claim 1, wherein the hard mask layer includes one of an oxide and a glass and the pad stack includes a nitride.

7. The method as recited in claim 1, further comprising the step of applying an anti-reflection coating to the hard mask layer.

8. A method for forming deep trenches in semiconductor fabrication, comprising the steps of:

providing a pad stack on a substrate;

forming a hard mask layer on the pad stack, the hard mask layer having a thickness of greater than about 700 nm;

patterning a resist layer on the hard mask layer, the resist layer having a thickness to prevent scalloping;

etching the hard mask layer selective to the resist layer down to the pad stack layer;

removing the resist layer;

after removing the resist layer, etching the pad stack selective to the hard mask layer such that a hole is opened down to the substrate; and etching the substrate to form deep trenches using the hard mask layer as a mask such that the thickness of the hard mask layer enables the deep trenches to be formed to a depth of greater than or equal to 7 microns.

9. The method as recited in claim 8, wherein the step of patterning a resist layer includes the step of depositing a resist layer having a thickness of between about 300 nm and about 800 nm.

10. The method as recited in claim 9, wherein the step of forming a hard mask layer includes the step of forming a hard mask layer having a thickness of between about 700 nm and about 3000 nm.

11. The method as recited in claim 8, wherein the hard mask layer includes a selectivity to the resist layer of between about 4 to 1 to about 8 to 1.

12. The method as recited in claim 8, wherein the pad stack includes a selectivity to the hard mask layer of greater than about 2 to 1.

13. The method as recited in claim 8, wherein the hard mask layer includes one of includes the step of depositing a resist layer having a thickness of between about 300 nm and about 800 nm.

14. The method as recited in claim 8, further comprising the step of applying an anti-reflection coating to the hard mask layer.

15. A method for opening holes for contacts in semiconductor fabrication comprising the steps of:

providing a dielectric layer on a target layer;

forming a hard mask layer on the dielectric layer;

patterning a resist layer on the hard mask layer, the resist layer having a thickness to prevent scalloping;

etching the hard mask layer selective to the resist layer down to the dielectric layer;

removing the resist layer;

after removing the resist layer, etching the dielectric layer selective to the hard mask layer such that a hole is opened down to the target layer; and depositing a conductive material in the hole such that a contact is formed to the target layer.

16. The method as recited in claim 15, wherein the step of patterning a resist layer includes the step of depositing a resist layer having a thickness of between about 300 nm and about 800 nm.

17. The method as recited in claim 16, wherein the step of forming a hard mask layer includes the step of forming a hard mask layer having a thickness of between about 700 nm and about 3000 nm.

18. The method as recited in claim 15, wherein the hard mask layer includes a selectivity to the resist layer of between about 4 to 1 to about 8 to 1.

19. The method as recited in claim 15, wherein the dielectric layer includes a selectivity to the hard mask layer of greater than about 2 to 1.

20. The method as recited in claim 15, wherein the hard mask layer includes one of an oxide and a glass and the dielectric layer includes one of a nitride and an oxide.

21. The method as recited in claim 15, further comprising the step of applying an anti-reflection coating to the hard mask layer.

* * * * *